US008732643B2

(12) United States Patent
Matsuoka

(10) Patent No.: US 8,732,643 B2
(45) Date of Patent: May 20, 2014

(54) SUPPORT METHOD, DESIGN SUPPORT APPARATUS, COMPUTER PRODUCT USING COMBINATION PATTERN IS PREPARED IN ADVANCE

(75) Inventor: Hidetoshi Matsuoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 385 days.

(21) Appl. No.: 12/817,619

(22) Filed: Jun. 17, 2010

(65) Prior Publication Data

US 2010/0257502 A1 Oct. 7, 2010

Related U.S. Application Data

(62) Division of application No. 11/706,211, filed on Feb. 15, 2007, now Pat. No. 7,765,507.

(30) Foreign Application Priority Data

Jun. 9, 2006 (JP) .................................. 2006-160411

(51) Int. Cl.
*G06F 17/50* (2006.01)

(52) U.S. Cl.
USPC ............................. 716/114; 716/126; 716/139

(58) Field of Classification Search
CPC ................................ G06F 17/50; G05F 14/04
USPC ........................................ 716/114, 126, 139
See application file for complete search history.

(56) References Cited

U.S. PATENT DOCUMENTS

| 6,009,248 | A | 12/1999 | Sato et al. | |
|---|---|---|---|---|
| 6,611,950 | B2 * | 8/2003 | Ishikura | 716/112 |
| 6,737,351 | B2 | 5/2004 | Ogawa et al. | |
| 6,831,365 | B1 | 12/2004 | Yao et al. | |
| 6,989,583 | B2 * | 1/2006 | Fujii | 257/621 |
| 7,067,919 | B2 | 6/2006 | Watanabe et al. | |
| 7,308,669 | B2 * | 12/2007 | Buehler et al. | 716/112 |
| 7,698,676 | B1 * | 4/2010 | Qian | 716/119 |
| 7,859,111 | B2 | 12/2010 | Okumura | |
| 2003/0116852 | A1 | 6/2003 | Watanabe et al. | |
| 2005/0280159 | A1 | 12/2005 | Okumura | |

FOREIGN PATENT DOCUMENTS

| JP | 04-355925 | 12/1992 |
|---|---|---|
| JP | 6-195420 | 7/1994 |
| JP | 6-349947 | 12/1994 |
| JP | 7-44602 | 2/1995 |
| JP | 10-163330 | 6/1998 |

(Continued)

OTHER PUBLICATIONS

Japanese Office Action issued Aug. 30, 2011 in corresponding Japanese Patent Application No. 2006-160411 (2 pages) (2 pages English Translation).

(Continued)

*Primary Examiner* — Thuan Do
(74) *Attorney, Agent, or Firm* — Staas & Halsey LLP

(57) ABSTRACT

A design support apparatus includes a detecting unit, a determining unit, and an inserting unit. The detecting unit detects a via that connects wirings in a circuit to be designed that is expressed by layout information. The determining unit determines the connection position of a dummy via that does not connect wirings, to be on at least one of wirings connected to the via detected by the detecting unit. The inserting unit inserts the dummy via at the connection position determined by the determining unit.

4 Claims, 11 Drawing Sheets

(56) References Cited

FOREIGN PATENT DOCUMENTS

| | | |
|---|---|---|
| JP | 11-163130 | 6/1999 |
| JP | 2000-012688 | 1/2000 |
| JP | 2003-197623 | 7/2003 |
| JP | 2005-142423 | 6/2005 |
| JP | 2005-347692 | 12/2005 |

OTHER PUBLICATIONS

U.S. Appl. No. 11/706,211, filed Feb. 15, 2007, Hidetoshi Matsuoka, Fujitsu Limited.

US Office Action issued on Jun. 12, 2009 in parent U.S. Appl. No. 11/706,211.

US Office Action issued on Sep. 25, 2009 in parent U.S. Appl. No. 11/706,211.

US Notice of Allowance issued on Apr. 15, 2010 in parent U.S. Appl. No. 11/706,211.

Japanese Office Action of Dec. 20, 2011 issued in Japanese Patent Application No. 2006-160411.

Japanese Office Action issued Nov. 26, 2013 for Japanese Application No. 2012-127594.

\* cited by examiner

SUPPORT METHOD, DESIGN SUPPORT APPARATUS, COMPUTER PRODUCT USING COMBINATION PATTERN IS PREPARED IN ADVANCE

CROSS-REFERENCE TO RELATED APPLICATIONS

This is a divisional application of U.S. Ser. No. 11/706,211, filed on Feb. 15, 2007, now U.S. Pat. No. 7,765,507 which also claims the benefit of priority from the prior Japanese Patent Application No. 2006-160411, filed on Jun. 9, 2006, the entire contents of which are incorporated herein by reference.

BACKGROUND OF THE INVENTION

1. Field of the Invention

The present invention relates to a technology for supporting layout design of a semiconductor integrated circuit.

2. Description of the Related Art

Secular change called stress migration breaks vias in a semiconductor integrated circuit to shorten the life of the integrated circuit. Such phenomenon has been long been recognized. Stress migration is a phenomenon that bubbles called vacancies caused in a metal wiring migrate due to the gradient of stress generated in the wiring. These vacancies migrate to be concentrated on a via to grow a gap called void. The growth of the gap ultimately breaks the via.

A semiconductor device in which the occurrence of wire breaking failures at conductive vias due to stress migration is reduced and a manufacturing method thereof have been achieved as a technique for alleviating stress migration (for example, Japanese Patent Application Laid-Open Publication No. 2005-142423).

The conventional techniques, however, are aimed at the alleviation of the stress migration occurring only on a wide wiring. This is because stress migration had been believed to occur on only the via that is connected to a wide wire. An effective means for alleviating stress migration, therefore, has not been provided for a narrow wiring, which leaves a problem unsolved that a via breaks to shorten the life of a semiconductor integrated circuit.

A method of enhancing resistance against stress migration by duplicating vias (redundant vias) has been widely known. This method, however, has a disadvantage in that space is limited for inserting duplicate vias, thereby allowing only 60% to 90% of single vias to be formed in the redundant vias. This method is applicable to less number of vias, compared to a dummy via insertion method that does not limit insertion points and that can be applied easily to more than 99% of vias.

SUMMARY OF THE INVENTION

It is an object of the present invention to at least solve the above problems in the conventional technologies.

A computer-readable recording medium according to one aspect of the present invention stores therein a design support program. The design support program causes a computer to execute detecting a via that connects wirings in a circuit expressed by layout information; determining a connection position of a dummy via that does not connect wirings to a position on at least one of the wirings connected to the via detected at the detecting; and inserting the dummy via at the connection position.

A computer-readable recording medium according to another aspect of the present invention stores therein a design support program. The design support program causes a computer to execute detecting a target wiring pattern to be changed in a circuit expressed by layout information; searching a group of modified wiring patterns that are wiring pattern modified so as to alleviate stress migration, for a modified wiring pattern that alleviates the stress migration more effectively than the target wiring pattern; and replacing the target wiring pattern with the modified wiring pattern searched at the searching.

A computer-readable recording medium according to still another aspect of the present invention stores therein a design support program. The design support program causes a computer to execute searching a circuit expressed by layout information for an insertion position of a via; accepting designation of a combination pattern constituted by a via that connects wirings and a dummy via that does not connect wirings in the circuit; and inserting the combination pattern at the insertion position.

A design support method according to still another aspect of the present invention includes detecting a via that connects wirings in a circuit expressed by layout information; determining a connection position of a dummy via that does not connect wirings to a position on at least one of the wirings connected to the via detected at the detecting; and inserting the dummy via at the connection position.

A design support method according to still another aspect of the present invention includes detecting a target wiring pattern to be changed in a circuit expressed by layout information; searching a group of modified wiring patterns that are wiring pattern modified so as to alleviate stress migration, for a modified wiring pattern that alleviates the stress migration more effectively than the target wiring pattern; and replacing the target wiring pattern with the modified wiring pattern searched at the searching.

A design support method according to still another aspect of the present invention includes searching a circuit expressed by layout information for an insertion position of a via; accepting designation of a combination pattern constituted by a via that connects wirings and a dummy via that does not connect wirings in the circuit; and inserting the combination pattern at the insertion position.

A design support apparatus according to still another aspect of the present invention includes a detecting unit that detects a via that connects wirings in a circuit expressed by layout information; a determining unit that determines a connection position of a dummy via that does not connect wirings to a position on at least one of the wirings connected to the via detected by the detecting unit; and an inserting unit that inserts the dummy via at the connection position.

A design support apparatus according to still another aspect of the present invention includes a detecting unit that detects a target wiring pattern to be changed in a circuit expressed by layout information; a searching unit that search a group of modified wiring patterns that are wiring pattern modified so as to alleviate stress migration, for a modified wiring pattern that alleviates the stress migration more effectively than the target wiring pattern; and a replacing unit that replaces the target wiring pattern with the modified wiring pattern searched by the searching unit.

A design support apparatus according to still another aspect of the present invention includes a searching unit that searches a circuit expressed by layout information for an insertion position of a via; an accepting unit that accepts designation of a combination pattern constituted by a via that connects wirings and a dummy via that does not connect wirings in the circuit; and an inserting unit that inserts the combination pattern at the insertion position.

The other objects, features, and advantages of the present invention are specifically set forth in or will become apparent from the following detailed description of the invention when read in conjunction with the accompanying drawings.

DETAILED DESCRIPTION OF THE PREFERRED EMBODIMENTS

Exemplary embodiments according to the present invention will be explained in detail with reference to the accompanying drawings.

Figure 1:
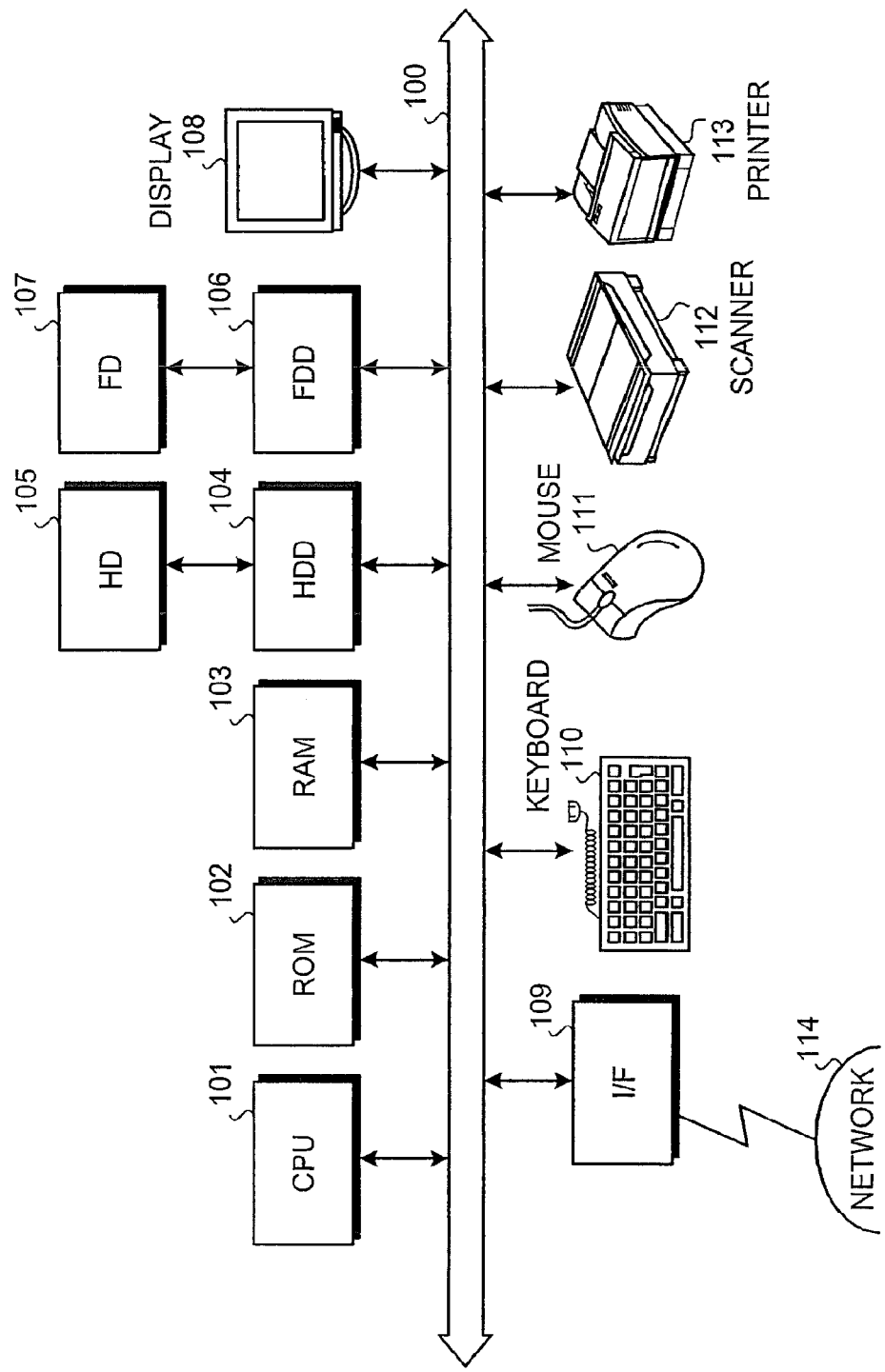
FIG. 1 is a schematic of a design support apparatus according to a first embodiment of the present invention.

FIG. 1 is a block diagram of a design support apparatus according to embodiments of the present invention. As shown in FIG. 1, the design support apparatus includes a central processing unit (CPU) 101, a read-only memory (ROM) 102, a random-access memory (ROM) 103, a hard disk drive (HDD) 104, a hard disk (HD) 105, a flexible disk drive (FDD) 106, a flexible disk (FD) 107 as an example of a removable recording medium, a display 108, an interface (I/F) 109, a keyboard 110, a mouse 111, a scanner 112, and a printer 113. These components are interconnected via a bus 100.

The CPU 101 controls the entire part of the design support apparatus. The ROM 102 stores a program such as a boot program. The RAM 103 is used as a work area of the CPU 101. The HDD 104 controls reading/writing of data from/to the HD 105 in accordance with a control by the CPU 101. The HD 105 stores data written under control by the HDD 104.

The FDD 106 controls reading/writing of data to/from the FD 107 in accordance with a control by the CPU 101. The FD 107 stores data written under control by the FDD 106, and allows the design support apparatus to read data stored in the FD 107.

The FD 107 serving may be replaced with a compact-disc read-only memory (CD-ROM), a compact-disc recordable (CD-R), a compact-disc rewritable (CD-RW), a magneto optical (MO) disk, a digital versatile disc (DVD), a memory card, etc. The display 108 displays a cursor, icons, tool boxes, and other data of documents, images, and functional information. For example, a cathode ray tube (CRT), a thin film transistor (TFT) crystal display, or a plasma display can be employed as the display 108.

The I/F 109 is connected to a network 114, such as the Internet, via a communication line, and is connected to an external device via the network 114. The I/F 109 serves as the interface with the network 114 and controls data input/output from/to the external device. For example, a modem or a local area network (LAN) adaptor can be employed as the I/F 109.

The keyboard 110 includes keys for entering characters, numerals, various instructions, etc., serving for data input. The keyboard 110 may be replaced with a touch-panel input pad or a numeric keypad. The mouse 111 is used to move a cursor, select a range, move a window, change a window size, etc. The mouse 111 may be replaced with another pointing device having a similar function as the mouse 111, such as a track ball and a joy stick.

The scanner 112 optically reads an image, taking the image into the design support apparatus. The scanner 112 may be provided with an optical character recognition (OCR) function. The printer 113 prints out image data or document data. For example, a laser printer or ink jet printer can be employed as the printer 113.

Figure 2:
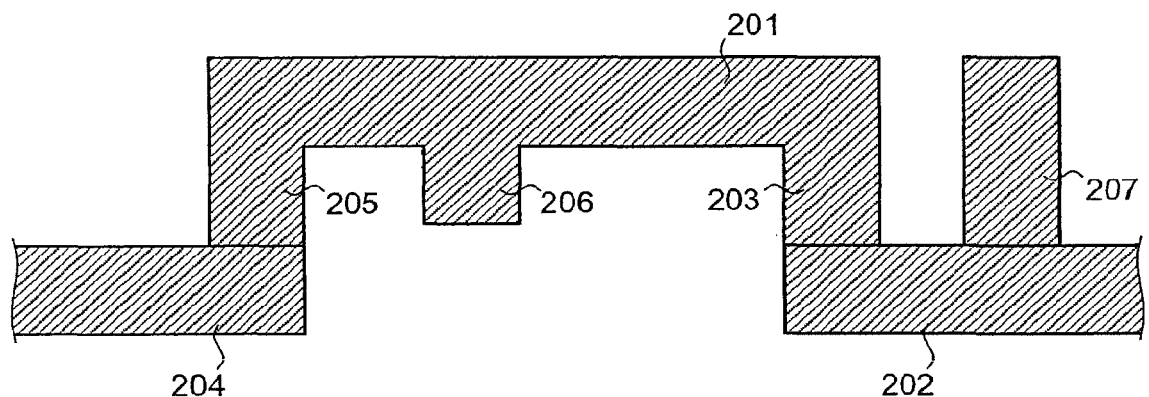
FIG. 2 is a schematic of dummy vias.

FIG. 2 is a schematic of a dummy via. As shown in FIG. 2, an upper layer wiring 201 is connected to a lower layer wiring 202 through a via 203. The upper layer wiring 201 is also connected to a lower layer wiring 204 through a via 205.

A dummy via 206 that is connected to neither of the lower layer wirings 202 nor 204 is formed on the upper layer wiring 201. A dummy via 207 that is not connected to the upper layer wiring 201 is formed on the lower layer wiring 202.

Figure 3:
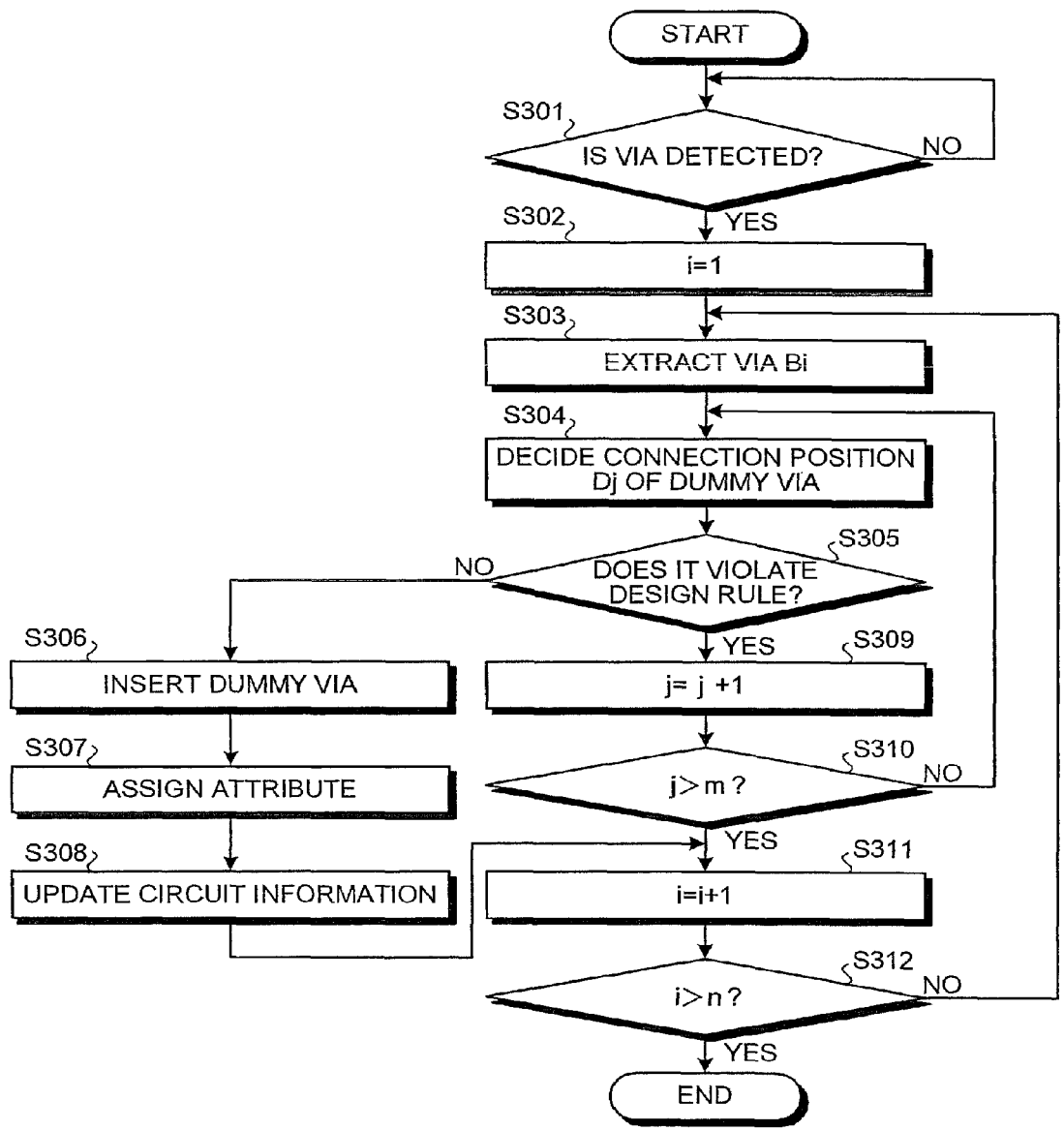
FIG. 3 is a flowchart of a design support process performed by the design support apparatus according to the first embodiment.

FIG. 3 is a flowchart of a design support process performed by the design support apparatus according to the first embodiment. First, the apparatus determines whether a via has been detected (step S301). Specifically, the apparatus detects a via arranged in a circuit to be designed that is expressed by layout information.

Waiting for detection of a via ("NO" at step S301), and when a via is detected ("YES" at step S301), the apparatus sets a value i=1 (step S302). The apparatus then extracts a via Bi from input circuit information (step S303). For example, the apparatus extracts one via from a plurality of detected vias.

Subsequently, the apparatus determines a connection position Dj for a dummy via at a position within a predetermined range from the via Bi (step S304). The predetermined range is a specific range that is expected to offer an effect of alleviating stress migration when the dummy via is inserted within the range. A user is allowed to set the range.

Stress migration is a phenomenon that bubbles called vacancies generated in a metal wiring migrate due to the gradient of a stress caused in the wire.

In an example shown in FIG. 2, the connection position Dj may be determined to be on the upper layer wiring 201, on the lower layer wiring 202, or on the lower layer wiring 204. After fixing the connection position Dj, the apparatus judges whether the connection position Dj violates a design rule (step S305).

In the flowchart shown in FIG. 3, when the connection position Dj does not violate the design rule at step S305 ("NO" at step S305), the apparatus inserts the dummy via Bi at the connection position Dj (step S306), and assigns an attribute to the dummy via Bi (step S307). The dummy via Bi to which an attribute has been assigned in advance may be inserted at the connection position.

The attribute is identification information indicating that a dummy via is not a subject of a design rule check in the circuit. A different attribute is assigned to the dummy via from that of a via constituting a wiring so that the dummy via is identified as a subject requiring no design rule check even if the dummy via has an unconnected end point. Thus, the error check process is not interrupted.

Circuit information is updated (step S308). Specifically, position information on the inserted dummy via and attribute information assigned to the dummy via is added to the layout information. Then, the process proceeds to step S311

When it is determined to violate the design rule ("YES" at step 305), the value j is incremented (step S309), and it is determined whether j>m is satisfied (step S310). The symbol m denotes the number of connection positions of the dummy vias. When it is determined that j>m is not satisfied ("NO" at step S310), the process returns to step S304, at which another dummy via connection position Dj is determined.

When it is determined that j>m is satisfied ("YES" at step S310), it is given up to make the via into a dummy via. In this case, the value i is incremented (step S311), and it is determined whether i>n is satisfied (step S312). The symbol n denotes the number of vias that can be made into dummy vias in the analyzed circuit. When it is determined that i>n is not satisfied ("NO" at step S312), the process returns to step S303, at which another via Bi is specified. When it is determined that i>n is satisfied ("YES" at step S312), a series of steps come to an end.

A certain via manufacturing process brings a case where insertion of separate dummy vias near both end points of a via improves the yield and reliability of the circuit. In such a case, both end points of the via should just be recognized as separate vias, where 2n is substituted for n. For the same reason, the upper end point or the lower end point of a via may solely be regarded as a subject of dummy via insertion.

Figure 4:
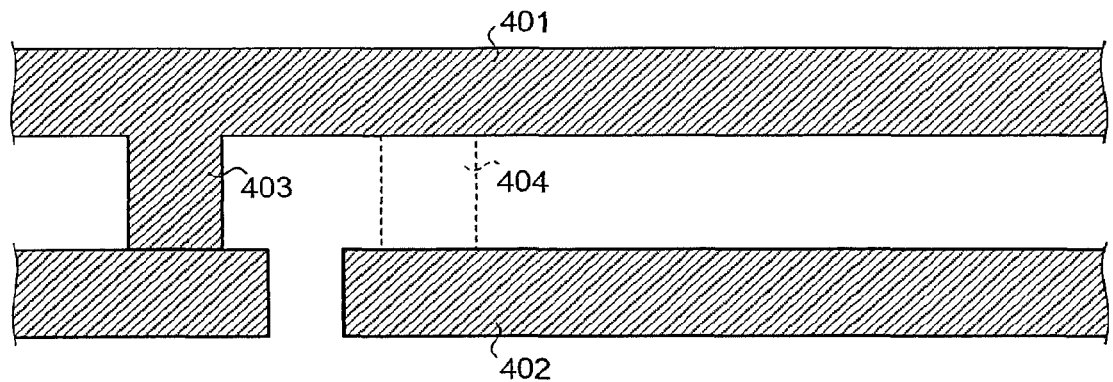
FIG. 4 is a schematic for explaining an example where a candidate at a connection position is determined to violate a design rule.

FIG. 4 is a schematic for explaining an example where it is determined to violate the design rule at step 305 in the flowchart shown in FIG. 3. As shown in FIG. 4, an upper layer wiring 401 on one net is connected to a lower layer wiring 402 on another net through a via 403.

By inserting the dummy via at a connection position 404, the upper layer wiring 401 is connected to the lower layer wiring 402 on another net. In this case, it is determined to violate the design rule. In another case, where no gap larger than a predetermined size is formed between the lower layer wiring 402 and the dummy via, it is determined to violate the design rule even if the upper layer wiring 401 is not connected to the lower layer wiring 402.

Figure 5:
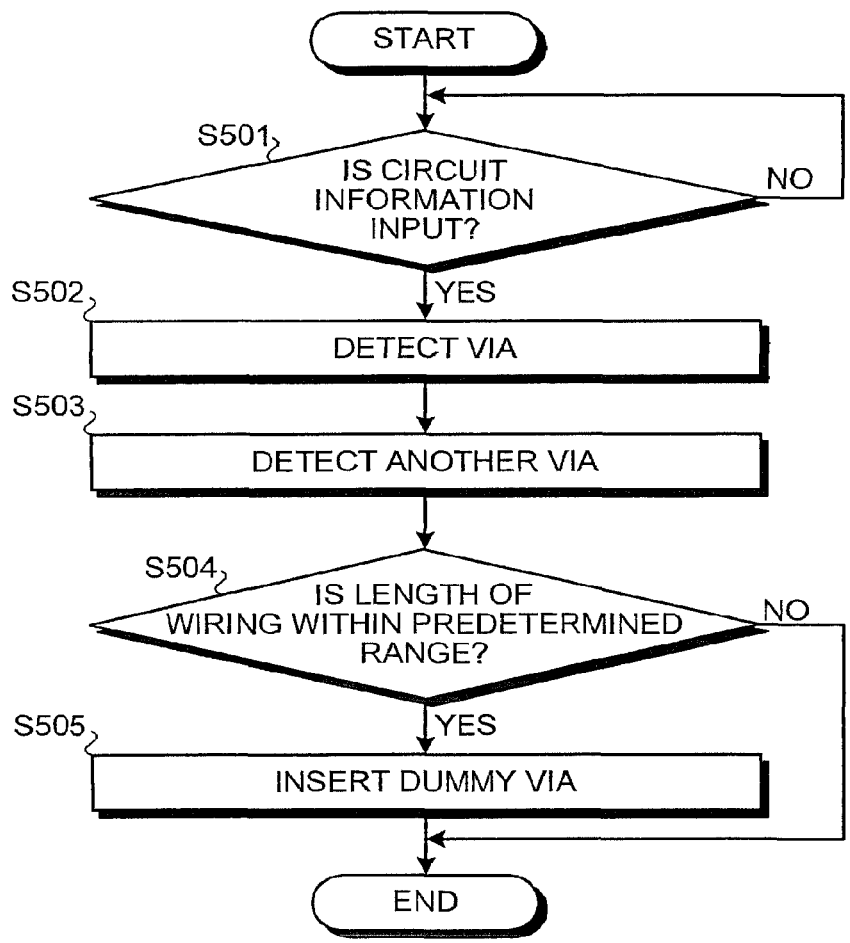
FIG. 5 is a flowchart of another design support process performed by the design support apparatus according to the first embodiment.

FIG. 5 is a flowchart of another design support process performed by the design support apparatus according to the first embodiment. First, it is determined whether circuit information has been input (step S501). Waiting for the input ("NO" at step S501), and when the circuit information is input ("YES" at step S501), the apparatus detects a via (step S502).

The apparatus then detects another via arranged on the same wiring on which the via detected at step S502 is arranged (step S503). The apparatus determines whether the length of a wiring portion between the via detected at step S502 and the via detected at step S503 is within a predetermined range (step S504). This given range may be determined for each wiring layer or specified by a user upon designing the circuit.

When the length of the wiring portion is within the predetermined range ("YES" at step S504), a dummy via is inserted in an approximate middle point between the two vias (step S505). Thus, a series of process ends. The reason for prescribing the range is because a shorter distance between the two vias results in fewer vacancies in the wiring, thereby reducing the influence of stress migration. When it is determined that the length of the wiring portion is not within the predetermined range ("NO" at step S504), a series of process ends.

Figure 6:
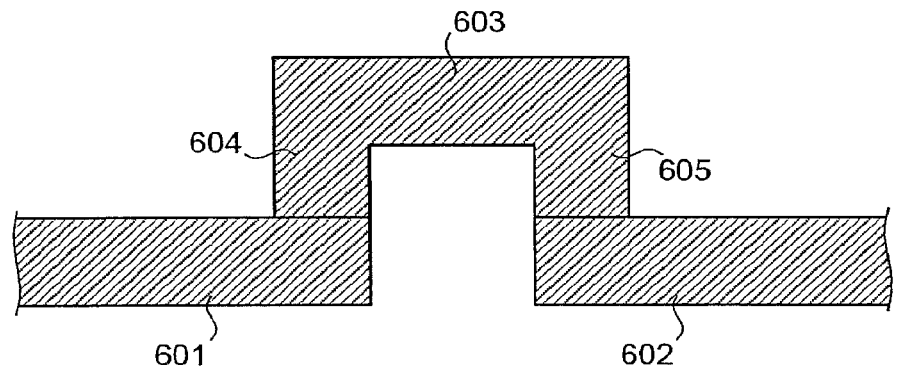
FIG. 6 is a schematic of a jumper via.

The apparatus may insert a jumper via instead of the dummy via at step S505. FIG. 6 is a schematic of a jumper via. As shown in FIG. 6, a wiring 601 and a wiring 602 are arranged on the same layer. A wiring 603 is arranged on a layer above the layer including the wirings 601 and 602. FIG. 6 thus depicts a structure that the wiring 601 changes its connection to connect to another wiring layer through a via 604, and then connects again to the original wiring layer through another via 605. This structure is called jumper via. Such a jumper via offers an effect of suppressing a static damage phenomenon called antenna effect, which is caused during circuit manufacturing. To avoid a case where the jumper via itself causes stress migration, the jumper via may not be inserted when the distance between two vias before insertion of the jumper via is too long.

Figure 7:
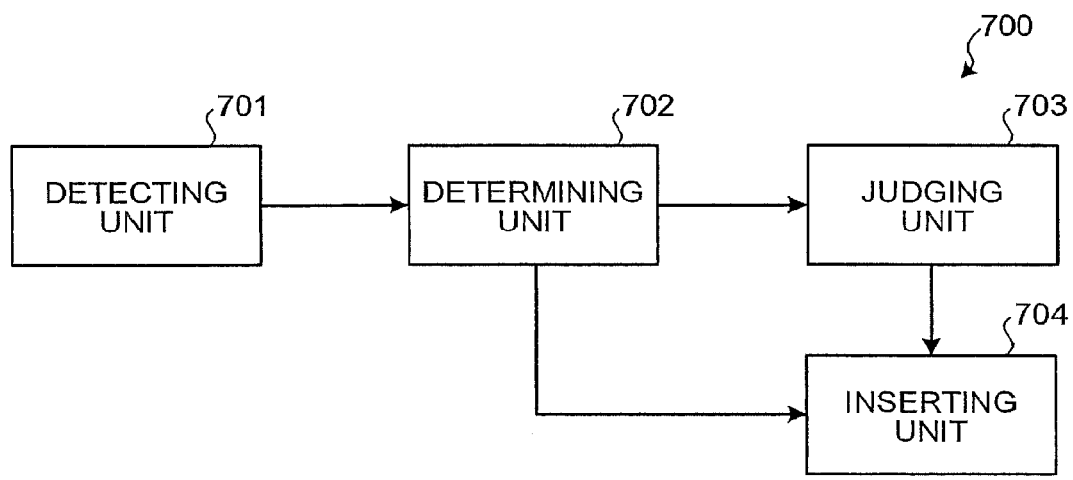
FIG. 7 is a block diagram of the design support apparatus according to the first embodiment.

FIG. 7 is a block diagram of the design support apparatus according to the first embodiment. As shown in FIG. 7, a design support apparatus 700 includes a detecting unit 701, a determining unit 702, a judging unit 703, and an inserting unit 704.

The detecting unit 701 detects a via that connects wirings in a circuit to be designed expressed by layout information. Specifically, the detecting unit 701 executes a via detection process shown at step S301 in FIG. 3.

The determining unit 702 determines the connection position of a dummy via that does not connect wirings to be on at least one of the wirings connected to the via detected by the detecting unit 701. Specifically, the determining unit 702 determines a dummy via connection position Dj shown at step S304 in FIG. 3.

The judging unit 703 judges whether the connection position of the dummy via violates the design rule on a layout. Specifically, the judging unit executes a determining process shown at step S305 in FIG. 3.

The inserting unit 704 inserts the dummy via at the connection position determined by the determining unit 702 when the judging unit 703 judges that the connection position does not violate the design rule. Specifically, the inserting unit 704 executes a dummy via insertion process shown at step S306 in FIG. 3.

Specifically, functions of the above detecting unit 701, the determining unit 702, the judging unit 703, and the inserting unit 704 are realized by, for example, the CPU 101 executing programs stored in the ROM 102, the ROM 103, the HD 105, the FD 107, etc.

As described above, according to the first embodiment, it is possible to prevent vacancies present in a wiring from reaching a via in a circuit to be designed, and of preventing interruption of the design rule check process conducted on the layout of a semiconductor integrated circuit.

While an example of alleviating stress migration by generating a dummy via has been described in the first embodiment, an example of alleviating stress migration by changing a wiring structure will be described in the second embodiment.

A buffer structure is obtained by changing a wiring form so as to alleviate stress migration. Specifically, the buffer structure includes a structure in which the travel distance of vacancies in the wiring is increased, a structure having a bent portion, and a structure having a projection.

Figure 8:
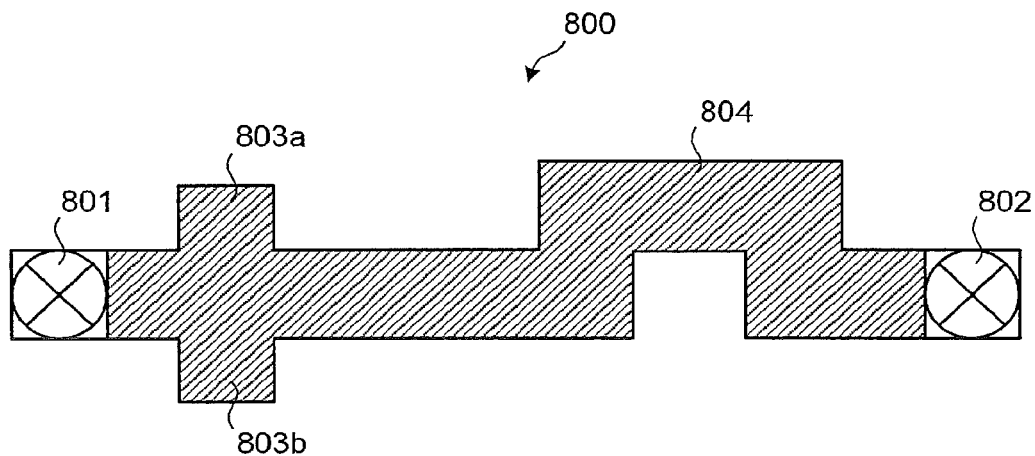
FIG. 8 is a schematic of a buffer structure.

FIG. 8 is a schematic of a buffer structure. As shown in FIG. 8, a via 801 and a via 802 that are connected to a wiring 800 electrically connect the wiring 800 to a wiring in a layer below the wiring 800 or to a wiring in a layer above the wiring 800 (not shown). The wiring 800 has projections 803a and 803b each formed on a part of the wiring 800.

Vacancies causing stress migration migrate along a side face of a wiring in some cases. To prevent this, the projections 803a and 803b are formed on the surface of the wiring 800 to trap vacancies in the projections 803a and 803b to keep the vacancies from reaching the via 801. The wiring 800, for example, may be made into such a structure as denoted by a reference numeral 804. The structure 804 prevents the vacancies from reaching the via 802.

Figure 9:
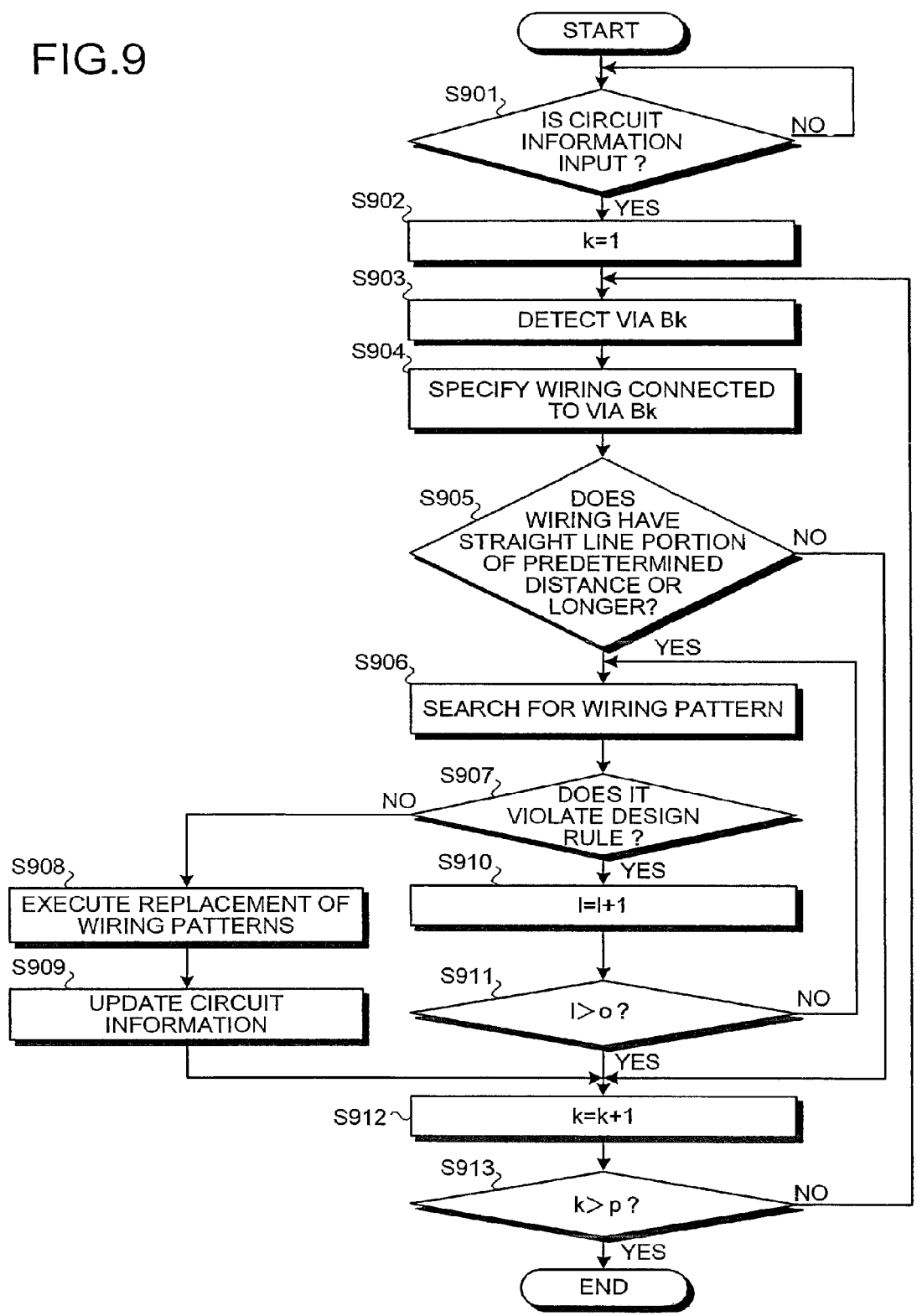
FIG. 9 is a flowchart of a design support process performed by a design support apparatus according to a second embodiment of the present invention.

FIG. 9 is a flowchart of a design support process performed by a design support apparatus according to the second embodiment of the present invention. First, the apparatus determines whether circuit information has been input (step S901). The circuit information is provided in a specific form of layout information.

Waiting for input of the circuit information ("NO" at step S901), and when the circuit information is input ("YES" at step S901), values are set to k=1, l=1 (step S902). The apparatus then specifies a via Bk (step S903), and then specifies a wiring connected to the via Bk (step S904).

Specifically, in the case shown in FIG. 2, for example, upon specifying the via 205, the upper layer wiring 201 and the lower layer wiring 204 are specified. In specifying a wiring, every wiring connected electrically to the via Bk may be specified, or either upper layer wiring 201 or lower layer wiring 204 only may be specified.

Referring back to FIG. 9, the apparatus then determines whether the specified wiring has a straight line portion of a predetermined distance or longer (step S905). Specifically, the apparatus refers to the layout information to determine whether the specified wiring has the length of the predetermined distance or longer. The distance may be set by a user in advance.

When it is determined that the specified wiring does not have the straight line portion of the predetermined distance or longer ("NO" at step S905), the process proceeds to step S912. When it is determined that the specified wiring has the straight line portion of the predetermined distance or longer ("YES" at step S905), the apparatus searches for a wiring pattern 1 for changing the form of specified wiring thereto (step S906).

Figure 10:
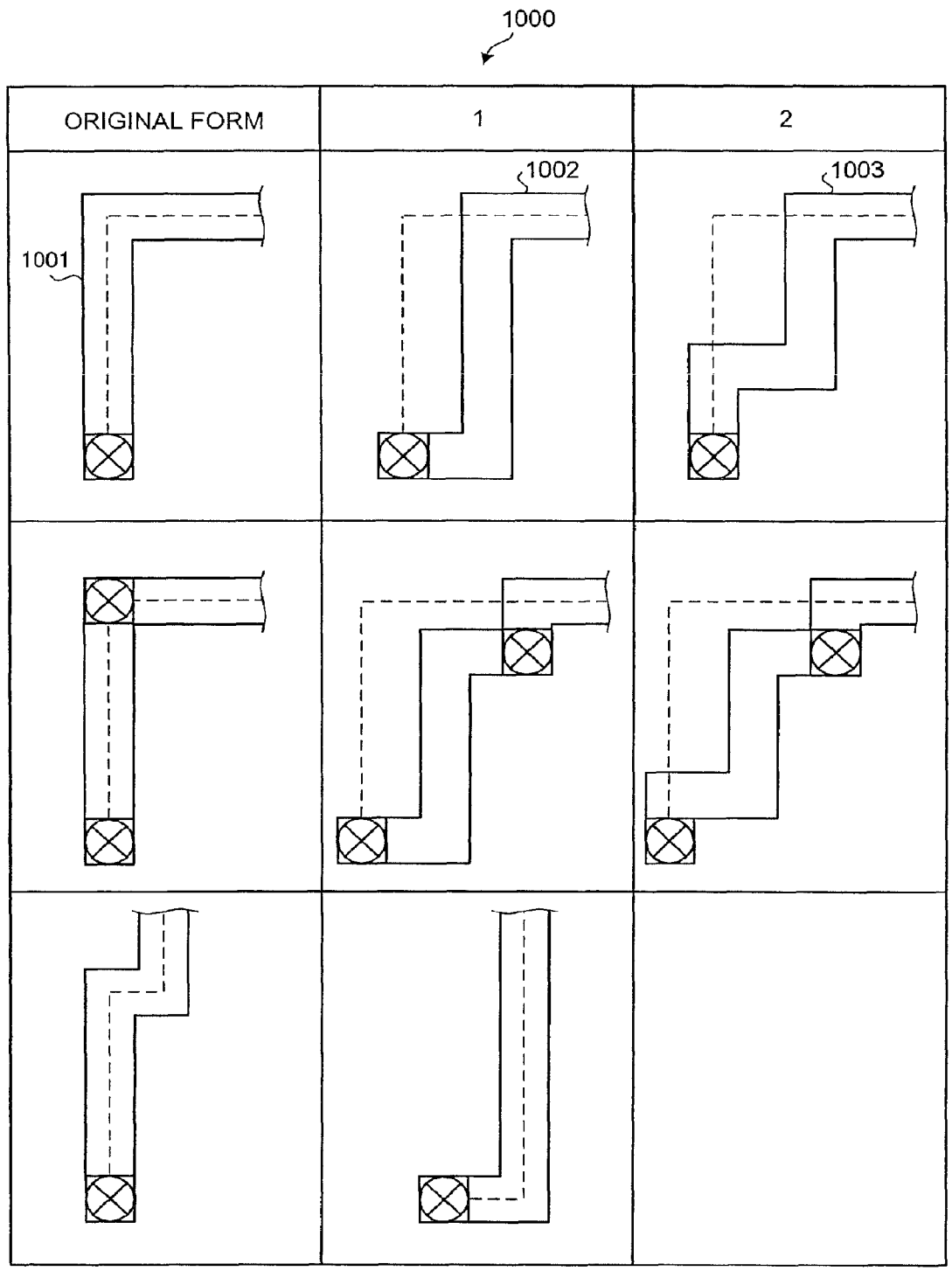
FIG. 10 is a chart for illustrating a wiring library.

FIG. 10 is a chart for illustrating a wiring library. As shown in FIG. 10, a wiring library 1000 includes, for example, layout information of wiring patterns (original form) to be modified (herein after, "modification subject"), and layout information of modified wiring patterns. The wiring library 1000 depicts an excerpted part of the whole layout information.

A modification subject has a form that is identical with or similar to the form of the wiring specified at step S904. The modification subject may not be a complete match in form to the specified wiring.

FIG. 10 depicts the layout information of the modification subject and wiring patterns to which the modification subject can be changed as actual wiring forms. Specifically, a modification subject 1001 can be modified into a modified wiring pattern 1002 or into a modified wiring pattern 1003. FIG. 10 depicts only the examples of wiring patterns with no increase in a wiring length, but wiring patterns with an increased wiring length can also be included. The number of modified wiring patterns varies depending on the types of change subject wiring patterns. These change subject wiring patterns may be generated automatically by a computer based on several generation rules. The generation rule is, for example, a rule to generate a bent near a via.

The apparatus determines whether modifying a wiring pattern into the wiring pattern 1 violates the design rule (step S907). Specifically, it is determined that the design rule is violated when modifying a wiring results in contact of the modified wiring with an existing wiring. It is also determined that the design rule is violated, for example, when insufficient space is secured between the modified wiring and the existing wiring.

When it is determined that the design rule is not violated ("NO" at step S907), the apparatus executes replacement of wiring patterns (step S908). The apparatus then updates the circuit information (step S909), and the process proceeds to step S912. Specifically, for example, the apparatus modifies a wiring pattern described in the circuit information to a modified wiring pattern.

When it is determined to violate the design rule ("YES" at step S907), the value l is incremented (step S910). It is determined whether $l>o$ is satisfied (step S911). The symbol o represents the number of modification candidates for a modification subject recorded in the wiring pattern library 1000. When it is determined that $l>o$ is not satisfied ("NO" at step S911), the process proceeds to step S906. Thus, the wiring pattern 1 is selected as the modification candidate.

When it is determined that $l>o$ is satisfied ("YES" at step S911), modification of the wiring form is given up, and the value k is incremented (step S912). It is determined whether $k>p$ is satisfied (step S913). The symbol p represents the number of vias specified by the circuit information. When it is determined that $k>p$ is not satisfied ("NO" at step S913), the process returns to step S903 and another via Bk is specified. When it is determined that $k>p$ is satisfied ("YES" at step S913), a series of process ends.

Figure 11:
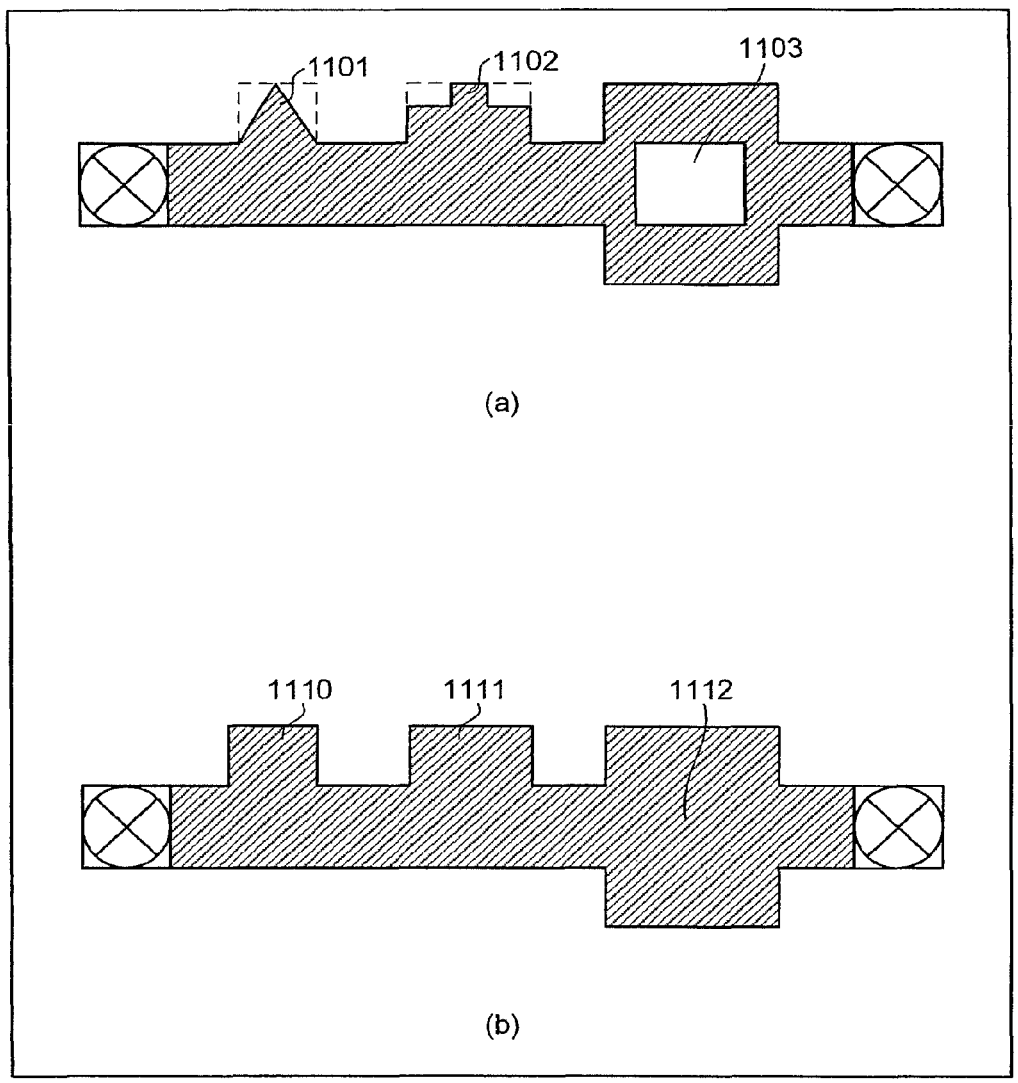
FIG. 11 is a schematic for explaining a shape of a component that violates the design rule.

The description of the above flowchart gives an explanation of an example of concluding a design rule violation when a changed wiring comes in contact with an existing wiring. A design rule violation regarding with the form of a component composing a wiring will then be described. FIG. 11 is a schematic for explaining a shape of a component that violates the design rule. A form (a) shown in FIG. 11 depicts a component form that violates the design rule. A form (b) shown in FIG. 11 depicts a component form that meets the design rule.

Usually, a design rule check is conducted to check if a designed form can be manufactured. As a result, such small patterns 1101 and 1102 may be determined to violate the design rule. A looped form 1103 may also be determined to violate the design rule.

To avoid design rule violation, such forms 1110, 1111, and 1112 meeting the design rule are recorded in the circuit information as components of a wiring. At the stage of designing, wiring designing is carried out using the forms 1101, 1102, and 1103. After a design rule check is completed, the forms of the recorded components are put back into the forms 1101, 1102, and 1103.

Figure 12:
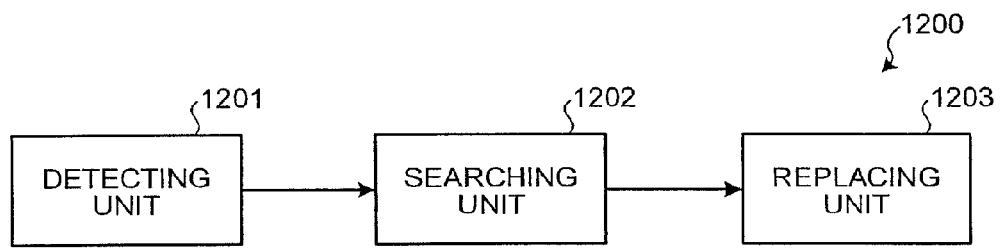
FIG. 12 is a block diagram of the design support apparatus according to the second embodiment.

FIG. 12 is a block diagram the design support apparatus according to the second embodiment. As shown in FIG. 12, a design support apparatus 1200 includes a detecting unit 1201, a searching unit 1202, and a replacing unit 1203.

The detecting unit 1201 detects a modification subject in a circuit to be designed expressed by layout information. Specifically, the detecting unit 1201 detects a via Bk, which is described at step S903 shown in FIG. 9, and detects a modification subject having a straight line portion. This modification subject is a wiring pattern stored in the wiring library 1000 shown in FIG. 10.

The searching unit 1202 searches for a wiring pattern of which the form is modified so as to alleviate stress migration more effectively than the modification subject detected by the detecting unit 1201 (hereinafter, "modified pattern"). Specifically, the searching unit 1202 executes a wiring pattern searching process that is described at step S906 shown in FIG. 9. A modified pattern is, for example, a wiring pattern stored in the wiring library 1000 shown in FIG. 10.

The modified patter is a wiring pattern of which the form is modified so that the travel distance of vacancies traveling through the modified pattern is longer than the travel distance of vacancies traveling through a modification subject. The modified pattern may be a wiring pattern that has more bent portions than a modification subject has.

The replacing unit 1203 replaces the modification subject with the modified pattern searched out by the searching unit 1202. Specifically, for example, the replacing unit 1203 executes a wiring pattern replacement process that is described at step S908 shown in FIG. 9.

Specifically, functions of the above detecting unit 1201, the searching unit 1202, and the replacing unit 1203 are realized by, for example, the CPU 101 executing programs stored in the ROM 102, the ROM 103, the HD 105, the FD 107, etc.

As described above, according to the second embodiment, it is possible to prevent vacancies present in a wiring from reaching a via in a circuit to be designed, and of automatically modifying a wiring pattern in a circuit to be designed into a wiring pattern that alleviates stress migration.

In the first and the second embodiments, an example of inserting a via or a buffer structure into an already designed layout has been explained. In the third embodiment, an example of inserting a dummy via or a buffer structure into a layout upon making the layout will be explained.

Figure 13:
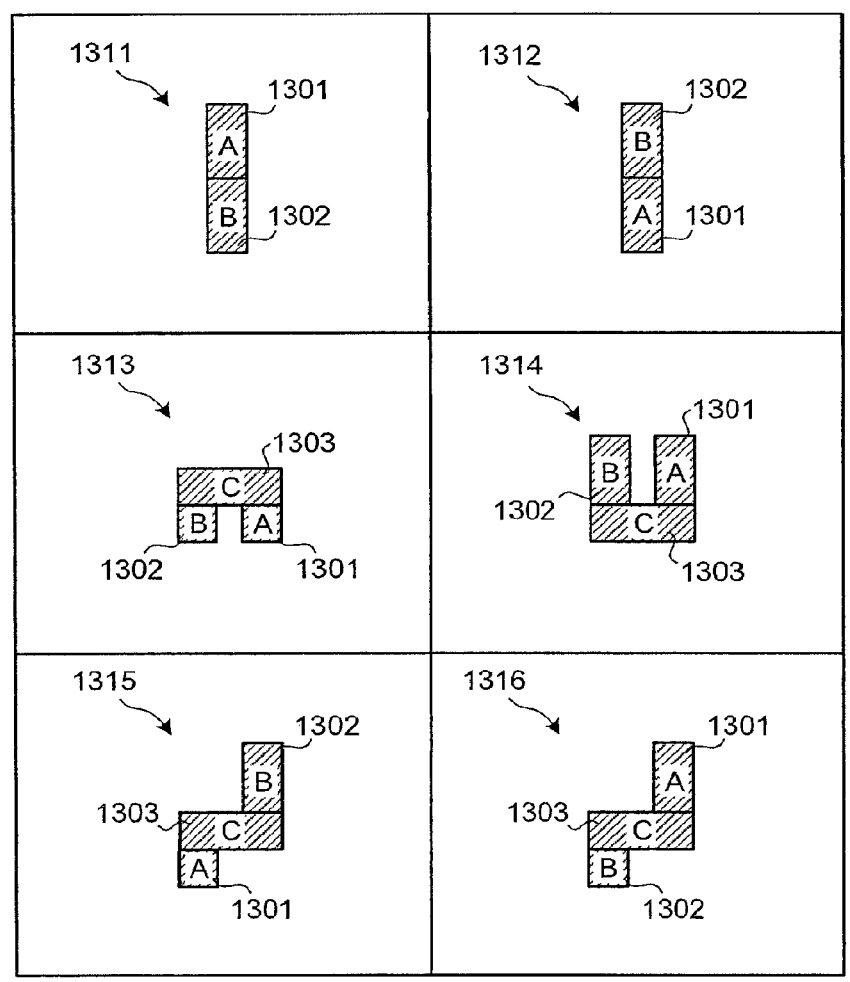
FIG. 13 is a chart for explaining patterns of set vias.

FIG. 13 is a chart for explaining patterns of set vias. A set via pattern is constructed by selecting and combining at least a via 1301 and a dummy via 1302 out of the via 1301, the dummy via 1302, and a wiring 1303.

For example, each of patterns 1311 and 1312 is a pattern constructed by combining the via 1301 and the dummy via 1302. Patterns 1313 to 1316 each represents a pattern that is made by connecting the via 1301 and the dummy via 1302 to the single wiring 1303.

Each of these patterns has a structure having a dummy via connected to one end point of a via. Such a structure having dummy vias connected to both end points of a via, the structure not shown, can also be considered as a set via pattern. For example, combining patterns 1311, 1314, and 1316, each having a structure of a dummy via connected to the lower end point of a via, and patterns 1312, 1313, and 1315, each having a structure of a dummy via connected to the upper end point of a via, produces nine types of set vias. These set vias may be prepared in advance, or automatically generated by a computer combining the patterns.

Figure 14:
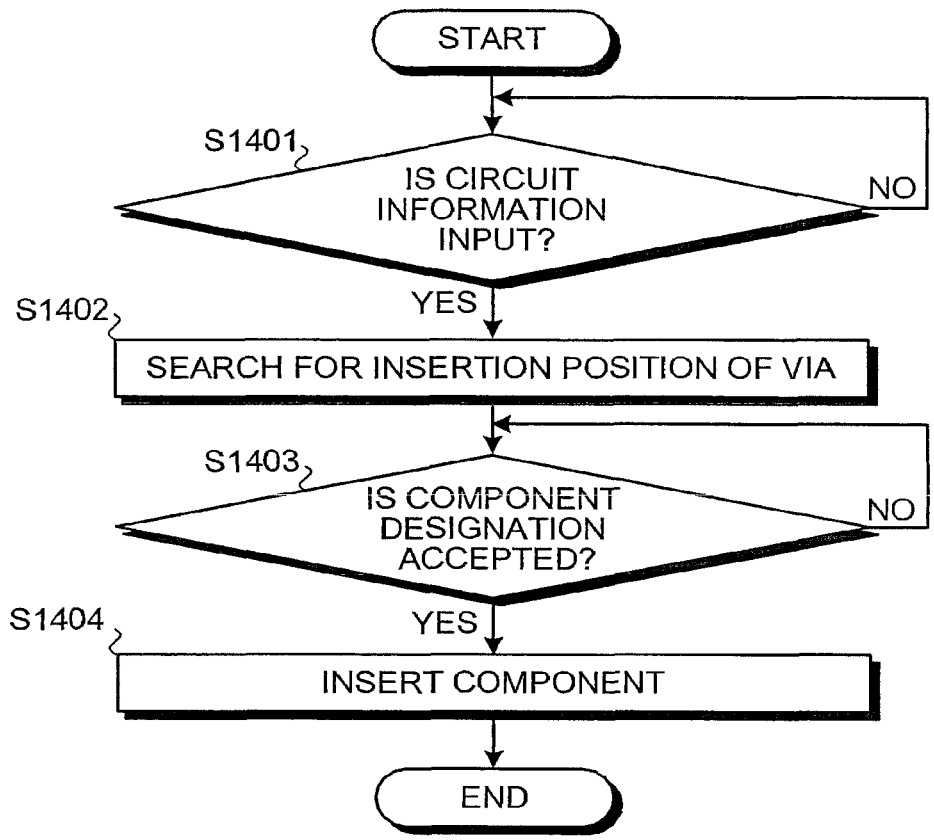
FIG. 14 is a flowchart of a design support process performed by the design support apparatus according to the third embodiment.

FIG. 14 is a flowchart of a design support process performed by a design support apparatus according to the third embodiment. First, the apparatus determines whether circuit information has been input (step S1401). The circuit information is provided in a specific form of, for example, layout information.

Waiting for input of the circuit information ("NO" at step S1401), and when the circuit information is input ("YES" at step S1401), the apparatus searches for a via insertion position (step S1402). Via insertion positions are embedded in layout information, so that the apparatus can search for the insertion position using the layout information as a clue. The apparatus then determines on whether designation of a component from a user has been accepted (step S1403). The component mentioned here means any one of the set via patterns 1311 to 1316 shown in FIG. 13.

Waiting for acceptance of component designation ("NO" at step S1403), and when the component designation is accepted ("YES" at step S1403), the designated component is inserted into the searched out insertion position (step S1404), at which a series of process ends.

The above flowchart gives the description of an example of allowing a user to designate a set via pattern and insert the set via defined by the pattern. In another example, however, a computer may select a set via and insert it into an insertion position.

As described above, according to the third embodiment, it is possible to design a layout allowing the alleviation of stress migration.

In the first to the third embodiments, examples of arranging a dummy via or changing a wiring pattern has been described. In the fourth embodiment, an example of locating two or more vias at positions separated from each other by a given distance will be described.

Figure 15A:
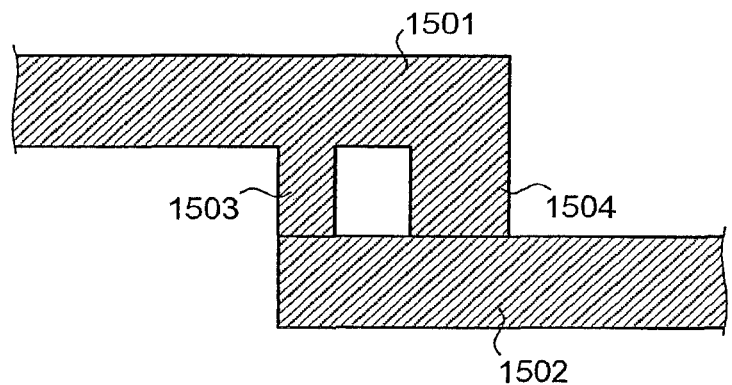
FIG. 15A is a schematic of a redundant via structure.

FIG. 15A is a schematic of a redundant via. As shown in FIG. 15A, an upper layer wiring 1501 is connected electrically to a lower layer wiring 1502 through vias 1503 and 1504. Providing two or more vias adjacent to each other, as shown in this structure, improves the reliability of electrical connection and manufacturing yield as well. Such redundant vias as shown in FIG. 15A are widely known.

Figure 15B:
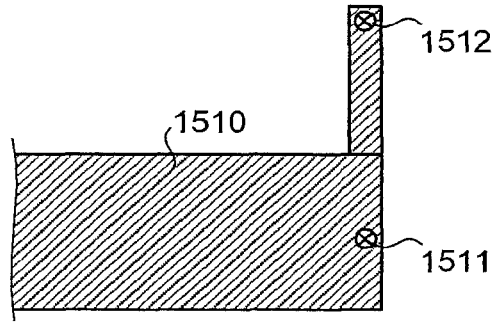
FIG. 15B is a schematic of a redundant via according to a fourth embodiment of the present invention.

FIG. 15B is a schematic of a redundant via according to the fourth embodiment. A via 1511 is arranged on a wiring 1510. Another via 1512 is arranged on a wiring connected to the wiring 1510.

According to the fourth embodiment, a redundant via is thus arranged at a position that is at the periphery of and is separated by a predetermined distance from the via 1511. By separating redundant vias from each other by a given distance or longer, as shown in FIG. 15B, it is possible to prevent each via composing the redundant vias from failing due to dust, etc.

Figure 16:
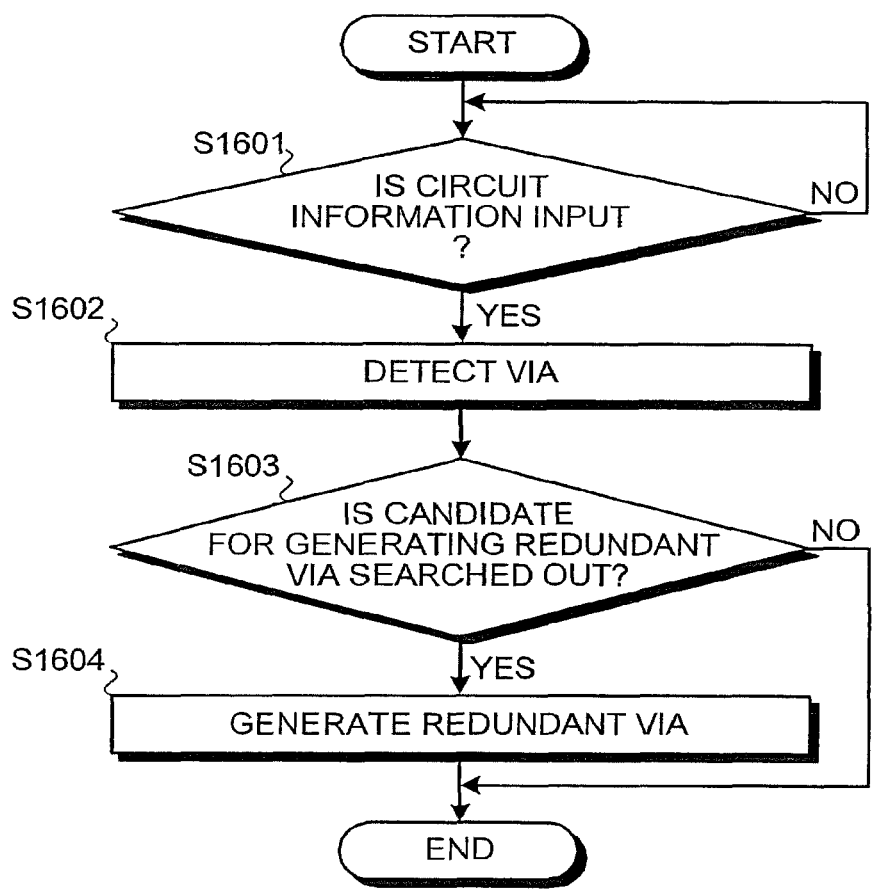
FIG. 16 is a flowchart of a design support process performed by the design support apparatus according to the fourth embodiment.

FIG. 16 is a flowchart of a design support process performed by the design support apparatus according to the fourth embodiment. First, the apparatus determines whether circuit information has been input (step S1601). Waiting for input of the circuit information ("NO" at step S1601), and when receiving input of the circuit information ("YES" at step S1601), a via is specified (step S1602).

Subsequently, the apparatus determines whether a candidate for generating a redundant via has been searched out (step S1603). When it is determined that the candidate for redundant via generation has been searched out ("YES" at step S1603), the apparatus generates a redundant via (step S1604). Thus, a series of process ends. When the candidate for redundant via generation has not been searched out ("NO" at step S1603), the series of process ends.

The above flowchart gives the description of an example of constructing redundant vias by arranging a separate via in adjacent to an already arranged via. Both redundant vias, however, may be arranged, for example, upon making a layout. Specifically, a layout may be designed using a wiring and a set via consisting of a combination of two vias.

According to the fourth embodiment, it is possible to alleviate stress migration, and such an accident that a piece of dust causes both redundant vias to fail. In the forth embodiment, therefore, reliability in electrical connection and a manufacturing yield are improved.

As described above, according to the design support program, the recording medium, the design support method, and the design support apparatus, it is possible to obtain a longer life of a semiconductor integrated circuit, and shorten a design period.

The design support method described in the first to the fourth embodiments can be carried out by causing a computer, such as personal computer and a work station, to execute a program prepared in advance. This program is recorded on a computer-readable recording medium, such as an HD, an FD, a CD-ROM, an MO, a DVD, etc., and is executed by the computer reading the program out of the recording medium. The program may be a transmission medium that can be distributed via a network, such as the Internet.

Each process procedure described above (FIGS. 3, 5, 9, 14, 16) is executed by starting the design support program when the program is necessary to follow a design flow. The program, however, may be kept operational constantly and caused to run when conditions expressed at S301, S501, S901, S1401, and S1601 are met.

According to the embodiments of the present invention, it is possible to obtain a longer life of and a shorter design period for a semiconductor integrated circuit.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A non-transitory computer-readable recording medium that stores therein a design support program causing a computer to execute:
searching a circuit expressed by layout information for an insertion position of a via;
accepting designation of a pattern of a combination of a via that connects wirings in the circuit and a dummy via that does not connect between wirings in the circuit; and
inserting the combination pattern at the insertion position,
wherein the combination pattern is prepared in advance.

2. The non-transitory computer-readable recording medium of claim 1, wherein an attribute is assigned to the dummy via that indicates the dummy via is not a subject of a design rule check in the circuit.

3. A design support method comprising:
using a computer, searching a circuit expressed by layout information for an insertion position of a via;
using the computer, accepting designation of a pattern of a combination of a via that connects between wirings in the circuit and a dummy via that does not connect between wirings in the circuit; and
inserting the pattern of the combination at the insertion position,
wherein the combination pattern is prepared in advance.

4. A design support apparatus comprising:
a searching unit that searches a circuit expressed by layout information for an insertion position of a via;
an accepting unit that accepts designation of a pattern of a combination of a via that connects wirings in the circuit and a dummy via that does not connect between wirings in the circuit; and
an inserting unit that inserts the combination pattern at the insertion position,
wherein the combination pattern is prepared in advance.

* * * * *

UNITED STATES PATENT AND TRADEMARK OFFICE
CERTIFICATE OF CORRECTION

| | |
|---|---|
| PATENT NO. | : 8,732,643 B2 |
| APPLICATION NO. | : 12/817619 |
| DATED | : May 20, 2014 |
| INVENTOR(S) | : Hidetoshi Matsuoka |

Page 1 of 1

It is certified that error appears in the above-identified patent and that said Letters Patent is hereby corrected as shown below:

On the Title Page, Item [54] and in the Specification, Column 1, Line 1, before "SUPPORT" insert -- DESIGN --.

Signed and Sealed this
Fourth Day of November, 2014

Michelle K. Lee
*Deputy Director of the United States Patent and Trademark Office*